US009607717B2

(12) United States Patent
Bailey et al.

(10) Patent No.: US 9,607,717 B2
(45) Date of Patent: Mar. 28, 2017

(54) RELIABILITY SCREENING OF FERROELECTRIC MEMORIES IN INTEGRATED CIRCUITS

(71) Applicant: Texas Instruments Incorporated, Dallas, TX (US)

(72) Inventors: Richard Bailey, Richardson, TX (US); John A. Rodriguez, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 199 days.

(21) Appl. No.: 14/519,894

(22) Filed: Oct. 21, 2014

(65) Prior Publication Data

US 2015/0357050 A1  Dec. 10, 2015

Related U.S. Application Data (60) Provisional application No. 62/008,986, filed on Jun. 6, 2014.

(51) Int. Cl.
*G11C 29/50* (2006.01)
*G11C 11/22* (2006.01)

(52) U.S. Cl.
CPC ...... *G11C 29/50016* (2013.01); *G11C 11/225* (2013.01)

(58) Field of Classification Search
CPC ............ G01R 31/2872; G01R 31/2875; G01R 31/2849; G01R 31/2855; G01R 31/2891; G01R 31/2817; G01R 31/2874; G01R 31/2642; G11C 29/006; G11C 29/50016; G11C 11/225; G06F 11/0754; G06F 11/076

USPC ......................................... 714/719
See application file for complete search history.

(56) References Cited

U.S. PATENT DOCUMENTS

| 5,821,005 A * | 10/1998 | Kijima | C23C 16/40 117/104 |
| 6,327,682 B1 * | 12/2001 | Chien | G11C 29/006 365/189.11 |
| 6,661,719 B1 * | 12/2003 | Shih | G11C 29/006 365/189.15 |
| 7,149,137 B2 | 12/2006 | Rodriguez et al. | |
| 7,813,193 B2 | 10/2010 | Rodriguez et al. | |

(Continued)

OTHER PUBLICATIONS

"Reliability characterization of a Ferroelectric Random Access Memory embedded within 130nm CMOS," 2008 17th IEEE International Symposium on the Applications of Ferroelectrics, Santa Re, NM, USA, 2008, pp. 1-2.*

(Continued)

*Primary Examiner* — Cynthia Britt
(74) *Attorney, Agent, or Firm* — Kenneth Liu; Charles A. Brill; Frank D. Cimino (57) ABSTRACT

A data retention reliability screen of integrated circuits including ferroelectric random access memory (FRAM) arrays. A reference voltage level is determined for each integrated circuit being tested, corresponding to the read of a high polarization capacitance data state. A number of FRAM cells in the integrated circuit are programmed to that data state, and then read at an elevated temperature, with the number of failing cells compared against a pass/fail threshold to determine whether the integrated circuit is vulnerable to long-term data retention failure.

20 Claims, 8 Drawing Sheets

(56) References Cited

U.S. PATENT DOCUMENTS

| | | | | |
|---|---|---|---|---|
| 2002/0107581 A1* | 8/2002 | Obradovic | ......... | G01R 31/2849 |
| | | | | 700/1 |
| 2002/0141242 A1* | 10/2002 | Noguchi | ............ | G11C 16/0416 |
| | | | | 365/185.22 |
| 2005/0125712 A1* | 6/2005 | Co | .................... | G01R 31/2855 |
| | | | | 714/718 |
| 2014/0108747 A1* | 4/2014 | Seol | ........................ | G06F 12/00 |
| | | | | 711/154 |

OTHER PUBLICATIONS

S. Summerfelt et al., "Embedded ferroelectric memory using a 130-nm 5 metal layer Cu / FSG logic process," Non-Volatile Memory Technology Symposium, 2004, 2004, pp. 153-154.*

Y. J. Song et al., "Highly reliable 32Mb FRAM with advanced capacitor technology," Microelectronics, 2004. 24th International Conference on, 2004, pp. 393-395 vol. 1.*

J. Rodriguez et al., "Reliability Demonstration of a Ferroelectric Random Access Memory Embedded within a 130nm CMOS Process," Non-Volatile Memory Technology Symposium, 2007. NVMTS '07, Albuquerque, NM, 2007, pp. 64-66.*

J. A. Rodriguez et al., "Reliability characterization of a Ferroelectric Random Access Memory embedded within 130nm CMOS," 2008 17th IEEE International Symposium on the Applications of Ferroelectrics, Santa Re, NM, USA, 2008, pp. 1-2.*

A. Rodriguez et al., "Reliability properties of low-voltage ferroelectric capacitors and memory arrays," in IEEE Transactions on Device and Materials Reliability, vol. 4, No. 3, pp. 436-449, Sep. 2004.*

* cited by examiner

RELIABILITY SCREENING OF FERROELECTRIC MEMORIES IN INTEGRATED CIRCUITS

CROSS-REFERENCE TO RELATED APPLICATIONS

This application claims priority, under 35 U.S.C. §119(e), of Provisional Application No. 62/008,986, filed Jun. 6, 2014, incorporated herein by this reference.

STATEMENT REGARDING FEDERALLY SPONSORED RESEARCH OR DEVELOPMENT

Not applicable.

BACKGROUND OF THE INVENTION

This invention is in the field of integrated circuit electrical testing. Embodiments of this invention are more specifically directed to the screening of integrated circuits including ferroelectric cells that are potentially of weak long term reliability.

Conventional metal-oxide-semiconductor (MOS) and complementary MOS (CMOS) logic and memory devices are prevalent in modern electronic systems, as they provide an excellent combination of fast switching times and low power dissipation, along with their high density and suitability for large-scale integration. As is fundamental in the art, however, those devices are essentially volatile, in that logic and memory circuits constructed according to these technologies do not retain their data states upon removal of bias power. Especially in mobile and miniature systems, the ability to store memory and logic states in a non-volatile fashion is very desirable. As a result, various technologies for constructing non-volatile devices have been developed in recent years.

A recently developed technology for realizing non-volatile solid-state memory devices involves the construction of capacitors in which the dielectric material is a polarizable ferroelectric material, such as lead zirconate titanate (PZT) or strontium-bismuth-tantalate (SBT), rather than silicon dioxide or silicon nitride as typically used in non-ferroelectric capacitors. Hysteresis in the charge-vs.-voltage (Q-V) characteristic, based on the polarization state of the ferroelectric material, enables the non-volatile storage of binary states in those capacitors. In contrast, conventional MOS capacitors lose their stored charge on power-down of the device. It has been observed that ferroelectric capacitors can be constructed by processes that are largely compatible with modern CMOS integrated circuits, for example placing capacitors above the transistor level, between overlying levels of metal conductors.

Ferroelectric technology is now utilized in non-volatile solid-state read/write random access memory (RAM) devices. These memory devices, commonly referred to as "ferroelectric RAM", or "FeRAM", or "FRAM" devices, are now commonplace in many electronic systems, particularly portable electronic devices and systems. FRAMs are especially attractive in implantable medical devices, such as pacemakers and defibrillators. Various memory cell architectures including ferroelectric capacitors are known in the art, including the well-known 2T-2C (two transistor, two capacitor) cells in which the two ferroelectric capacitors in a cell are polarized to complementary states. Another type of FRAM cell is based on the well-known "6T" CMOS static RAM cell, which operates as an SRAM cell during normal operation, but in which ferroelectric capacitors coupled to each storage node can be programmed with the stored data state to preserve memory contents in non-volatile fashion. Ferroelectric capacitors are also implemented in some integrated circuits as programmable analog capacitors. Ferroelectric cells constructed in a 1T-1C (one transistor, one capacitor) arrangement, similar to conventional dynamic RAM memory cells, are attractive because of their small chip area, but at a cost of less robust read performance than the latching but larger area 2T-2C and 6T cell types.

Figure 1A:
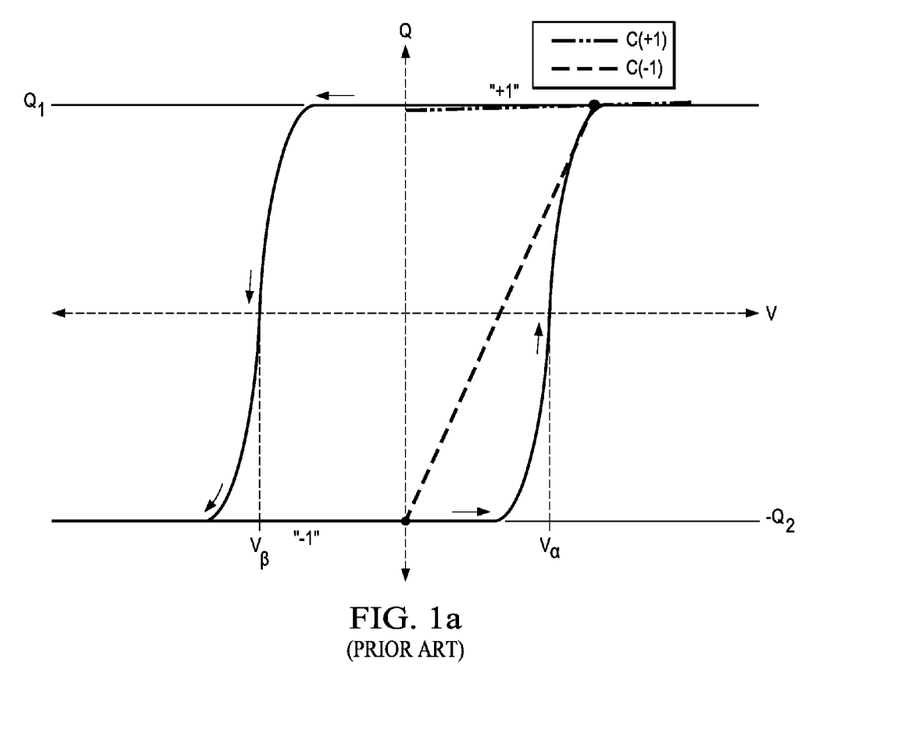
FIG. 1a is a plot of a charge-vs.-voltage characteristic of a conventional ferroelectric capacitor.

FIG. 1a illustrates an example of a Q-V characteristic of a conventional ferroelectric capacitor. As shown, the charge (Q) stored across the conductive plates depends on the voltage applied to the plates (V), and also on the recent history of that voltage. If the voltage V applied across the capacitor plates exceeds a "coercive" voltage $+V_\alpha$, the capacitor polarizes into the "+1" state. According to this characteristic, once polarized to the "+1" state, so long as voltage V remains above coercive voltage $-V_\beta$, the capacitor exhibits a stored charge of $+Q_1$. Conversely, if the voltage V applied across the capacitor plates is more negative than coercive voltage $-V_\beta$, the capacitor is polarized into the "−1" state, and will exhibit a stored charge of $-Q_2$ for applied voltage V below $+V_\alpha$.

An important characteristic of ferroelectric capacitors, for purposes of non-volatile storage in integrated circuits, is the difference in capacitance exhibited by a ferroelectric capacitor between its polarized states. As fundamental in the art, the capacitance of an element refers to the ratio of stored charge to applied voltage. While the ferroelectric capacitor has a linear capacitance, by virtue of its construction as parallel plates separated by a dielectric film (i.e., the ferroelectric material), it also exhibits significant polarization capacitance (i.e., charge storage) in response to changes in polarization state that occurs upon application of a polarizing voltage. For example, referring to FIG. 1a, the polarization of a ferroelectric capacitor from its "−1" state to its "+1" state is reflected in a relatively high capacitance C(−1), reflecting the storage of polarization charge in the capacitor in response to the change of polarization state by the voltage exceeding coercive voltage $V_\alpha$. On the other hand, a capacitor that already in its "+1" state exhibits little capacitance C(+1) due to polarization, since its ferroelectric domains are already aligned in the direction of the applied coercive voltage, causing little additional polarization charge to be stored. As will be evident from the following description, a stored logic state is read by interrogating the capacitance of the ferroelectric capacitors to discern its polarization state.

By way of further background, it has been observed that the polarization properties of conventional ferroelectric capacitors are quite sensitive to the presence of hydrogen. More specifically, the infiltration of hydrogen into the ferroelectric film is believed to cause degradation in the hysteresis characteristic of the ferroelectric capacitor. In FRAM memory applications, this degradation is exhibited by weakened data retention, also referred to as "imprint degradation", particularly for the "−1" polarization state according to the nomenclature of FIG. 1a.

Figure 1B:
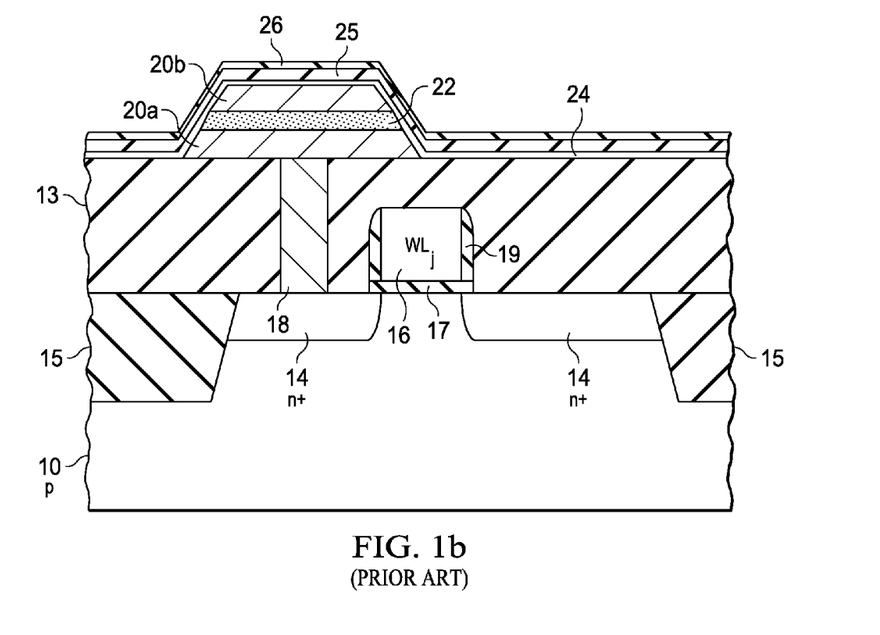
FIG. 1b is a cross-sectional view illustrating a portion of an integrated circuit including a ferroelectric capacitor constructed according to conventional methods.

FIG. 1b illustrates, in cross-section, a typical construction of a portion of an integrated circuit including a ferroelectric capacitor and an n-channel metal-oxide-semiconductor (MOS) transistor. In this arrangement, a MOS transistor is realized at the surface of p-type substrate 10 (or well), at an active region disposed between isolation dielectric structures 15 formed by shallow trench isolation in this example. N+ source/drain regions 14 are formed into substrate 10 on opposing sides of polysilicon gate element 16 in a selfaligned manner. Gate element 16 is separated from the surface of the active region by gate dielectric 17, thus forming the transistor. Sidewall spacers 19 are provided on the sides of gate element 16 as useful in forming source/drain region extensions, as known in the art. A ferroelectric capacitor is formed in this structure by a ferroelectric stack including conductive plates 20a, 20b (formed of an elemental metal, or a conductive metal compound such as a metal nitride, conductive metal oxide, or a silicide, or a stack of two or more of these layers) between which ferroelectric material 22 is disposed. In this example, ferroelectric material 22 consists of PZT. Bottom conductive plate 20a is connected to the source/drain region 14 by conductive plug 18 formed into a contact opening etched through dielectric film 13.

Conventional process flows for manufacturing ferroelectric capacitors such as shown in FIG. 1b have addressed the issue of hydrogen contamination of the ferroelectric material by depositing passivation films over the ferroelectric capacitor structure. For example, referring to FIG. 1b, multiple passivation films are formed over the ferroelectric stack to inhibit hydrogen contamination of ferroelectric material 22. In this conventional example, aluminum oxide layer 24 is formed over the ferroelectric stack, for example to a thickness of about 25 nm, and serves both as a hydrogen barrier and also as a chemical barrier between ferroelectric material 22 and the other passivation films. Silicon nitride layer 25 is formed over aluminum oxide layer 24, for example to a thickness of about 50 nm, by high-density plasma (HDP), followed by a second silicon nitride film 26, deposited by chemical vapor deposition (CVD) to a thickness (e.g., about 50 nm) sufficient to fill any gaps or thin spots (i.e., voids) in HDP nitride 25, and which increases the thickness of the overall passivation layer. However, long-term reliability testing shows that some portion of the population of integrated circuits including FRAM cells remain vulnerable to depolarization over time, despite this passivation.

BRIEF SUMMARY OF THE INVENTION

Disclosed embodiments provide a method of performing a time-zero screen of integrated circuits including ferroelectric memory cells that detects those cells and circuits that will exhibit weakened data retention.

Disclosed embodiments provide such a method that can be implemented without significant additional manufacturing test time.

Disclosed embodiments provide such a method that can be performed on integrated circuits in wafer form.

Disclosed embodiments provide such a method that can be implemented without necessitating changes to design of the ferroelectric memory.

Other objects and advantages of the disclosed embodiments will be apparent to those of ordinary skill in the art having reference to the following specification together with its drawings.

According to certain embodiments, a method of testing an integrated circuit including ferroelectric memory cells, for example in the form of 1T-1C ferroelectric random access memory (FRAM) cells arranged in an array, for potential data retention failures is implemented by programming a plurality of its FRAM cells to a first data state. The plurality of cells are then read at an elevated temperature to detect the stored data state. The integrated circuit is deemed to fail the test upon the read operation returning a second data state in greater than a preselected number of the plurality of cells.

According to an embodiment, that method is performed on a plurality of such integrated circuits that are disposed on the same semiconductor wafer, with the read operation performed while the wafer disposed on a chuck heated to the elevated temperature.

According to an embodiment, that method is implemented by evaluating, at a lower temperature such as room temperature, for each of the plurality of integrated circuits, a first reference voltage level at which fewer than a selected number of the FRAM cells return the second data state. In this embodiment, an offset reference voltage level is determined relative to the first reference voltage level, and the elevated temperature read of the plurality of cells is performed relative to the offset reference voltage level.

DETAILED DESCRIPTION OF THE INVENTION

The one or more embodiments described in this specification are implemented into the manufacturing testing of ferroelectric random access memories (FRAMs), as it is contemplated that such implementation is particularly advantageous in that context. However, it is also contemplated that concepts of this invention may be beneficially applied to other applications, for example to integrated circuits including ferroelectric elements of other types beyond memory cells, or in the characterization or other test applications applied to FRAMs and other ferroelectric devices. Accordingly, it is to be understood that the following description is provided by way of example only, and is not intended to limit the true scope of this invention as claimed.

Figure 2A:
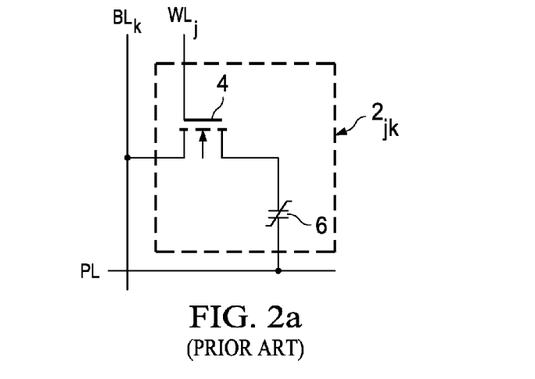
FIGS. 2a and 2b are electrical diagrams, in schematic and block form, illustrating a conventional 1T-1C ferroelectric memory cell and its operation.

FIG. 2a illustrates a typical arrangement of a conventional 1T-1C FRAM cell, in connection with which embodiments described herein may be used. Electrically, as shown in FIG. 2a, FRAM cell $2_{jk}$ represents a single cell in an array of similar cells 2, residing in row j and column k of that array. Cell $2_{jk}$ includes n-channel pass transistor 4 and ferroelectric capacitor 6. The source/drain path of transistor 4 is connected between bit line $BL_k$ for column k of the array, and the top plate of ferroelectric capacitor 6; the gate of transistor 4 is controlled by word line $WL_j$ for row j of the array. The bottom plate of ferroelectric capacitor 6 is connected to plate line PL, which may be in common for all cells 2 in the array (or in a particular portion of the array, depending on the architecture). In operation, selection of row j causes word line $WL_j$ to be energized, turning on transistor 4 in cell $2_{jk}$ (and in all of cells 2 in row j), which connects the top plate of capacitor 6 to bit line $BL_k$. Sense circuitry coupled to bit line $BL_k$ is then able to sense the polarization state of ferroelectric capacitor 6, as will be discussed below.

One way in which cell $2_{jk}$ of FIG. 2a may be realized is by way of a structure such as shown in FIG. 1b discussed above. Referring to that FIG. 1b, n-channel MOS transistor 4 is realized by N+ source/drain regions 14 on opposing sides of polysilicon gate element 16, with gate element serving as word line $WL_j$ and one of source/drain regions 14 serving as bit line $BL_k$. Ferroelectric capacitor 6 of cell $2_{jk}$ is implemented by the ferroelectric stack of conductive plates 20a, 20b disposed below and above, respectively, ferroelectric material 22 formed of PZT. Bottom conductive plate 20a is connected to the source/drain region 14, and thus to transistor 4, by conductive plug 18 through dielectric film 13.

As known in the art, for 1T-1C memory cells such as that of FIG. 2a that are sensed by applying a voltage across ferroelectric capacitor 6, between bit line $BL_k$ and plate line PL with pass transistor 4 turned on, the polarization state that exhibits the higher capacitance when sensed is typically considered as the "1" data state. In this example, the sensing operation corresponds to that illustrated in the hysteresis diagram of FIG. 1a, in which the polarization state is sensed by applying a positive voltage across ferroelectric capacitor 6. Accordingly, in this description, ferroelectric capacitor 6 of 1T-1C FRAM cell $2_{jk}$ in its "−1" polarization state (i.e., exhibiting the higher capacitance C(−1) state shown in FIG. 1a) will be considered as the "1" data state, and the "+1" polarization state (lower capacitance C(+1) state) of capacitor 6 will be considered as the "0" data state of cell $2_{jk}$. In operation, cell $2_{jk}$ is programmed by applying voltages to plate line PL and bit line $BL_k$ that, with word line $WL_j$ energized, polarizing capacitor 6 into the desired polarization state. In this example, a "0" data state corresponding to the "+1" polarization state of FIG. 1a is written by the application of a low voltage ($V_{ss}$) to bit line $BL_k$, turning on word line $WL_j$, and then raising plate line PL to a high voltage ($V_{cc}$). Conversely, a "1" data state corresponding to the "−1" polarization state is written by the application of a low voltage ($V_{ss}$) to plate line PL, turning on word line $WL_j$, and then raising bit line $BL_k$ to a high voltage ($V_{cc}$).

Figure 2B:
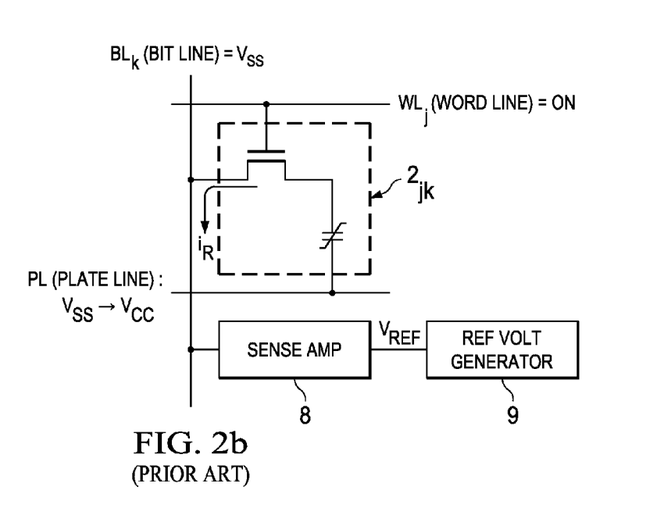
Figure 2C:
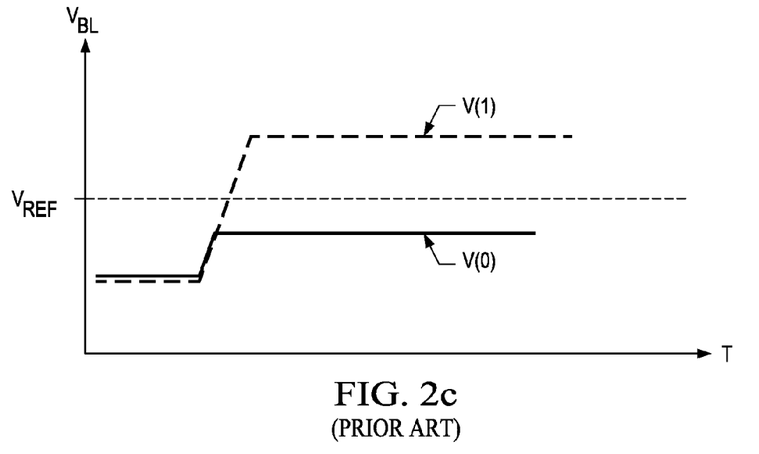
FIG. 2c is a timing diagram illustrating the operation of a read of the 1T-1C ferroelectric memory cell of FIGS. 2a and 2b.

FIGS. 2b and 2c illustrate the read operation of FRAM cell $2_{jk}$. As shown in FIG. 2b, the read is performed by applying a low voltage $V_{ss}$ to bit line $BL_k$, and then raising the voltage of plate line PL from the low voltage $V_{ss}$ to the high voltage $V_{cc}$ with word line $WL_j$ energized and transistor 4 turned on. The raising of the voltage at plate line PL and the lower plate of capacitor 6 interrogates the polarization capacitance of capacitor 6, according to the hysteresis diagram of FIG. 1a, specifically by way of sensing the level of read current $i_R$ conducted by cell $2_{jk}$ via bit line $BL_k$. Sense amplifier 8, which is coupled to bit line $BL_k$ will effectively compare a voltage induced by read current $i_R$ to a reference voltage $V_{REF}$ generated by reference voltage generator circuit 9 to discern the stored data state. As shown in FIG. 2c, if capacitor 6 is in the "+1" polarization state, read current $i_R$ will be relatively low, exhibited by a relatively low level ($<V_{REF}$) voltage transition V(0) that is interpreted by sense amplifier 8 as a "0" data state. Conversely, if capacitor 6 is in the "−1" polarization state, read current $i_R$ will be relatively strong and will result in a relatively high level ($>V_{REF}$) voltage transition V(1) that is interpreted by sense amplifier 8 as the "1" data state. In this arrangement, the read of the "1" data state is destructive, because the read operation essentially programs cell $2_{jk}$ into the opposite data state; a write-back operation is they typically performed to return cell $2_{jk}$ to its previous polarization state.

It has been observed from long-term reliability testing that some number of FRAM devices remain vulnerable to depolarization over time. This depolarization is reflected in data retention failures during long-term (~1000 hour) high temperature bake. These data retention failures are believed to be due to non-uniformity of the hydrogen barrier films or variations in hydrogen exposure over the device population, resulting in infiltration of hydrogen into ferroelectric material and thus degradation in the hysteresis characteristic of ferroelectric capacitors incorporating that material. In FRAM memory applications, this degradation, which is also referred to as "imprint degradation", is exhibited by weakened data retention for the polarization state that exhibits higher capacitance when sensed by application of the sensing voltage. In a sensing operation that applies a positive polarity voltage across the capacitor, as in FIG. 1a, it is the "−1" polarization state that has the higher capacitance C(−1), and that exhibits weakened data retention due to this mechanism. In cell $2_{jk}$ of FIGS. 2a and 2b, this higher capacitance ("−1") polarization state corresponds to the "1" data state, and so the weakened data retention will appear as degraded read margin for the "1" data state. 2T-2C FRAM cells are less susceptible to this type of data retention failure than are 1T-1C FRAM cells, because of the reinforcement of read current by the cross-coupled inverters of the 2T-2C cells. Indeed, it is believed that data retention performance continues, to some extent, to limit the use of 1T-1C FRAM memories for many applications.

Figure 3A:
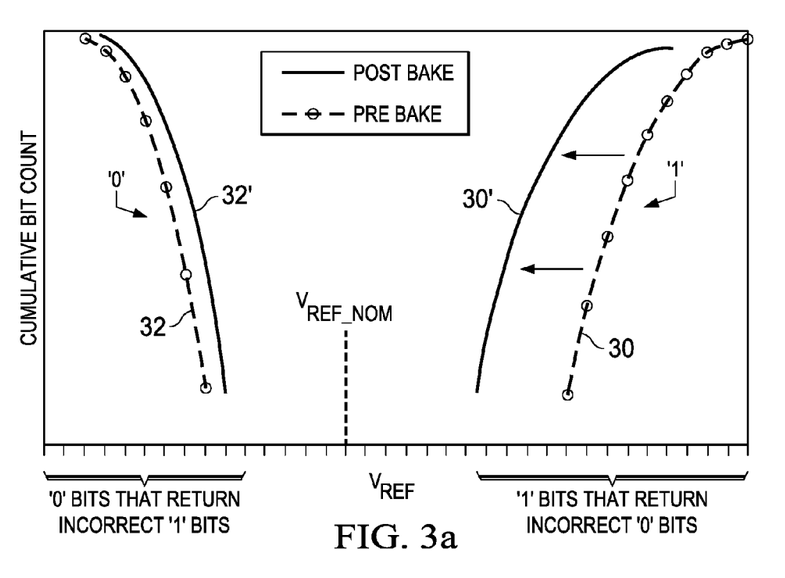
FIG. 3a illustrates plots of cumulative bit fail distribution for an integrated circuit including a 1T-1C ferroelectric random access memory (FRAM) versus reference voltage level.

FIG. 3a illustrates the behavior of this mechanism of read margin degradation for an array of FRAM cells $2_{jk}$ constructed as described above relative to FIGS. 2a and 2b. The plots of FIG. 3a are in the form of plots of a cumulative failed bit count with varying levels of reference voltage $V_{REF}$ generated by reference voltage generator circuit 9 and applied to sense amplifier 8 of FIG. 2c in the read operation, for the "0" and "1" programmed data states and before and after a long term data retention bake. Reference voltage $V_{REF}$ NOM illustrates a nominal reference voltage, for example as used in normal operation of the memory, from which reference voltage $V_{REF}$ varies in deriving the plots shown. Specifically, plots 30, 30' illustrate the cumulative number of bits in the array that are programmed to a "1" data state, but return the incorrect "0" data state when read, with increasing reference voltage $V_{REF}$; plot 30 illustrates this performance for a single FRAM array prior to a data retention bake, and plot 30' illustrates this performance for the same array after a data retention bake of 1000 hours at 125 deg C. Similarly, plots 32, 32' show the cumulative number of failures of bits that are programmed to a "0" data state, prior to and after data retention bake, respectively, as reference voltage $V_{REF}$ decreases.

As evident from the shift from plot 30 to plot 30' in FIG. 3a, the data retention bake causes degradation of the "1" data state, which corresponds to the polarization state ("−1" in this case) exhibiting the larger capacitance in the sensing operation. Conversely, the lower polarization capacitance "0" data state ("+1" polarization state) exhibits a much lower shift due to the data retention bake, from plot 32 to plot 32'; loss of polarization due to hydrogen contamination has a lesser effect where the read voltage is of the same polarity as the polarization state.

Figure 3B:
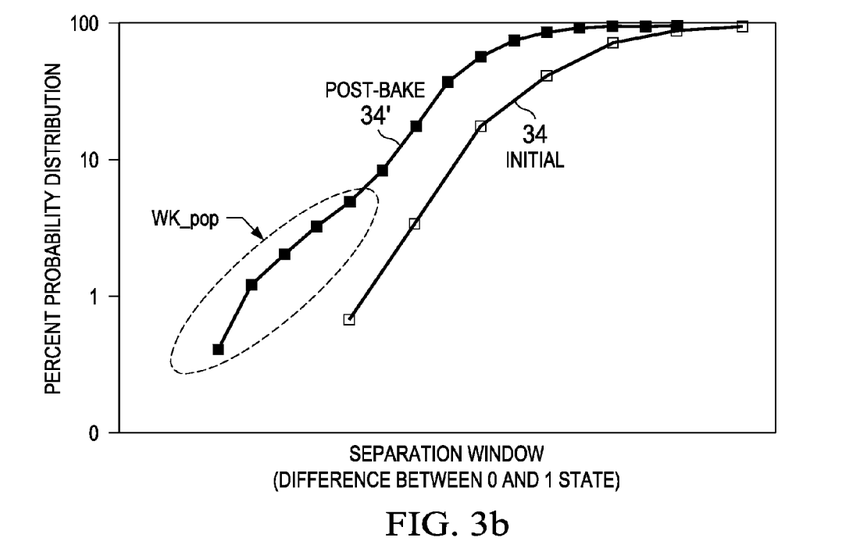
FIG. 3b illustrates plots of failure distribution of a population of integrated circuits including 1T-1C FRAM memories versus separation window.

While FIG. 3a illustrates the cumulative failed bits within a single FRAM array, FIG. 3b illustrates the probability distribution of a population of integrated circuits that each include FRAM memory arrays, before and after a long term data retention bake. The horizontal axis of plots 34, 34' corresponds to a separation window, namely the voltage differential between "0" and "1" data states exhibited by each individual integrated circuit die in the population (in wafer form), with the vertical axis corresponding to a cumulative percent probability distribution of the integrated circuits in the population. Plot 34 is the probability distribution plot for the population prior to the data retention bake, and plot 34' is the probability distribution plot for the same population following a data retention bake of 1000 hours at 125 deg C.

As evident from FIG. 3b, not only does the separation window shift for the entire population as a result of the data retention bake, but a portion WK_pop of that population exhibits a greater degradation in the separation window as a result of the data retention bake, with a slope in its failure distribution differing from that of the remainder of the population. It is believed that the integrated circuits in this weaker portion WK_pop of the overall population present a greater risk of failure in the field over operating life than the remainder of the population. As mentioned above, because FRAM cells of the 1T-1C type are more susceptible to this type of data retention failure than are latching cell types such as the 2T-2C cell, this susceptibility limits the use of 1T-1C FRAM memories for many applications, at least to some extent. It is therefore desirable to remove these devices from the population in the manufacturing process.

The difficulty is, of course, identifying this weaker portion WK_pop of the population of FRAM devices at the time of manufacture. The duration of the long-term data retention bake that identifies these weak devices cannot be tolerated in the manufacturing flow, even on a sample basis. In addition, those devices that are subjected to the data retention bake, even if not in the weaker portion WK_pop, are aged by the process. While time-zero electrical testing in manufacture using a stringent reference voltage $V_{REF}$ for the "1" data state, namely close to the initial fail voltage of plot 30 of FIG. 3a, will eliminate those integrated circuits (also referred to herein as "devices") in the population that have the poorest read margin of the population, it has been observed that those devices are not necessarily the ones that exhibit the greatest shift in data retention bake. As a result, conventional time-zero electrical screening has been observed to both fail devices that do not exhibit the data retention vulnerability (false negatives) while passing devices that have the data retention vulnerability (false positives), resulting in yield loss while not improving reliability of the population.

As will be described according to the embodiments disclosed in this specification, a time zero electric test method that identifies and screens integrated circuits for this data retention vulnerability, and that is suitable for implementation into the manufacturing test flow, is provided. It is contemplated that these embodiments can enable the use of 1T-1C FRAM cells in non-volatile memory applications, with acceptable data retention reliability.

Figure 4:
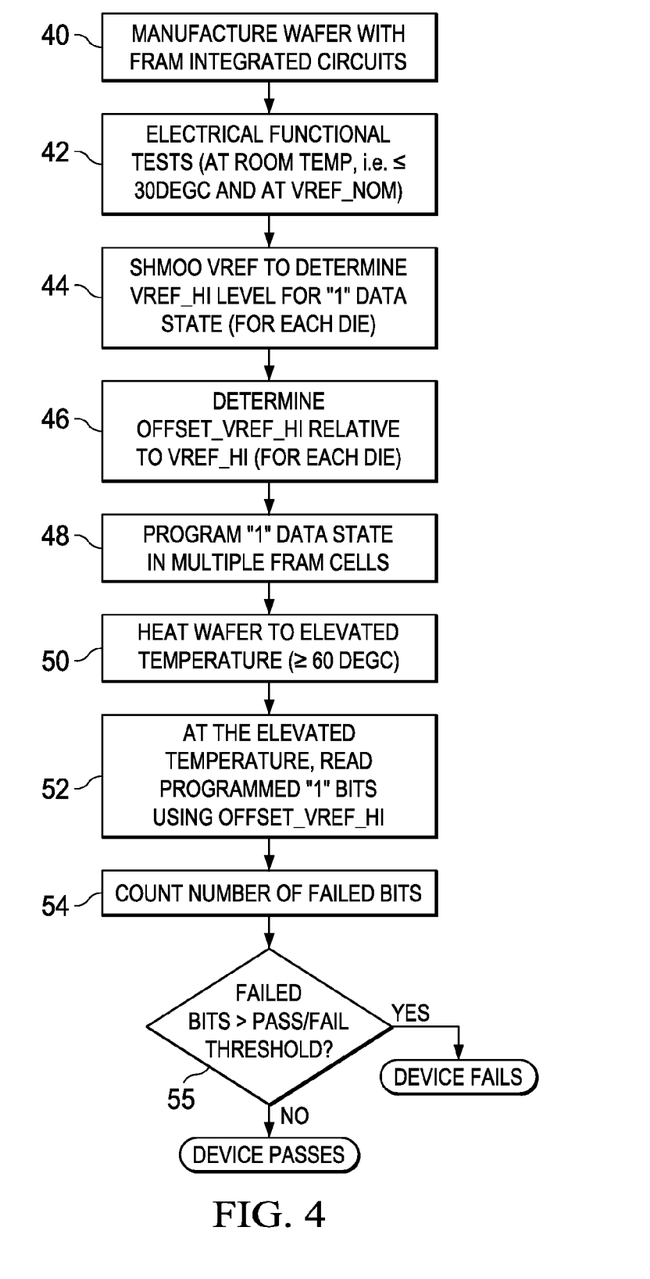
FIG. 4 is a flow diagram of a time-zero reliability screen according to an embodiment.

Referring now to FIG. 4, a method of screening integrated circuits including FRAM cells, such as 1T-1C cells $2_{jk}$ described above, at the time of manufacture to identify those with weak data retention reliability, according to an embodiment, will now be described. According to this embodiment, this reliability screening is performed at the time of manufacture, by way of "multiprobe" electrical testing of the integrated circuits in wafer form. As such, the reliability screen according to this embodiment follows process 40 in FIG. 4, in which integrated circuits including ferroelectric memory cells, such as arranged in a memory array, are formed at the surface of a semiconductor wafer in the conventional manner. It is contemplated that the particular arrangements and implementations of FRAM cells in the devices manufactured in process 40 may vary widely, for example as one or more FRAM memory arrays either embedded within a larger scale integrated circuit such as a microprocessor or microcontroller, as a stand alone FRAM memory integrated circuit, and the like.

The following description of the reliability screen according to this embodiment will be described with reference to a single integrated circuit, for clarity of the description. As those skilled in the art having reference to this specification will readily recognize, it is of course contemplated that each of the integrated circuits on the wafer manufactured in process 40 will be tested in the same manner, from process to process in this test flow, in the usual manner for electrical testing of circuits in wafer form (commonly referred to as "multiprobe"). In addition, it is contemplated that the reliability screen of this embodiment, and of the other embodiments described in this specification, may be carried out using conventional electrical test equipment implemented at one or more conventional multiprobe test stations.

In process 42, electrical functional and parametric testing of the integrated circuit is performed. The particular tests performed as part of this process 42 are contemplated to include typical functionality tests (write and read of both data states to all cells), tests of pattern sensitivity, address decoder functionality (e.g., the well-known "march" test), and performance tests such as evaluating read access times. In this embodiment, it is contemplated that functional test process 42 will be performed at room temperature (i.e., ≤30 deg C.), and using a nominal reference voltage (such as VREF_NOM shown in FIG. 3a) for its read operations.

Figure 5A:
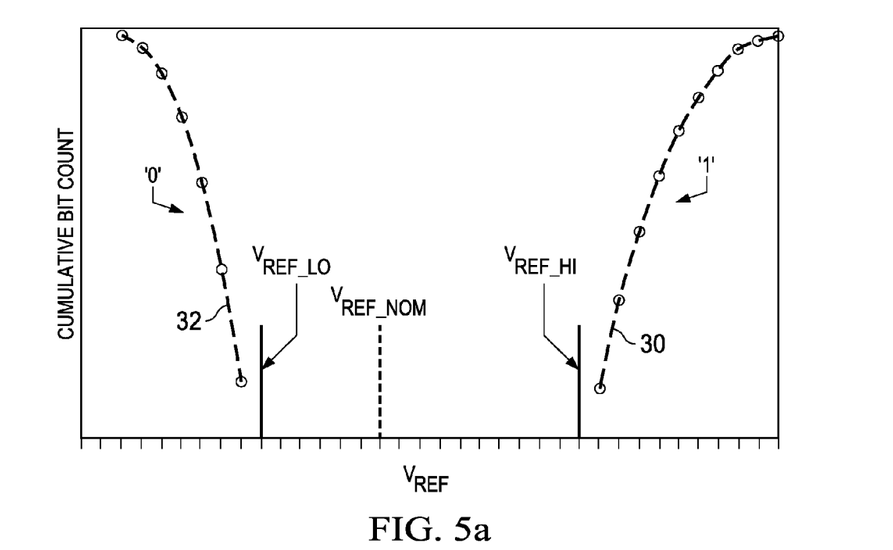
FIGS. 5a and 5b illustrate plots of cumulative bit fail distribution for an integrated circuit including a 1T-1C FRAM versus reference voltage level, illustrating the operation of processes in the embodiment of FIG. 4.

In process 44, the test equipment is operated to determine, for each device (i.e., each die, in wafer form), a reference voltage VREF_HI at which FRAM cells programmed to a "1" data state begin to return the incorrect "0" data state when read. FIG. 5a illustrates the plots of cumulative fail bit count for the "0" and "1" programmed data states relative to reference voltage $V_{REF}$, as discussed above relative to FIG. 3a. As shown in FIG. 5a, reference voltage level VREF_HI is a level of reference voltage $V_{REF}$ applied to sense amplifiers 8 at which the first, or first few, FRAM cells $2_{jk}$ programmed to a "1" data state return a "0" data state when read. Conversely, reference voltage level VREF_LO is the level of reference voltage $V_{REF}$ applied to sense amplifiers 8 at which the first, or first few, FRAM cells $2_{jk}$ programmed to a "0" data state return a "1" data state when read. Nominal reference voltage level VREF_NOM as used in normal operation of the FRAM memory is illustrated in FIG. 5a for comparison. As shown in FIG. 5a, nominal reference voltage level VREF_NOM is closer to level VREF_LO than to level VREF_HI, considering that the "1" data state failed bit distribution tends to shift over time to a greater extent than does the "0" data state failed bit distribution, as discussed above relative to FIG. 3a.

Referring to FIG. 2c, process 44 in this embodiment may be performed by reference voltage generator circuit 9 (e.g., a programmable or controllable circuit internal to the integrated circuit itself) iteratively incrementing the level of reference voltage $V_{REF}$ that is used by sense amplifier 8 to determine the data state of each of the programmed "1" cells when accessed. More specifically, process 44 according to this embodiment may be performed by programming a number of cells $2_{jk}$ in each integrated circuit on the wafer to a "1" data state, reading those states relative to a particular reference voltage $V_{REF}$ level, and if all of the programmed cells output a "1" data state, incrementing reference voltage $V_{REF}$ and repeating the programming and reading process at the higher reference voltage $V_{REF}$; the reference voltage $V_{REF}$ at which the first programmed cell returns an incorrect "0" data state when read is considered as reference voltage VREF_HI in this example. Alternatively, reference voltage level VREF_HI may be considered as the voltage at which some fraction (e.g., 1%) or number (e.g., ten) of programmed cells returns the incorrect data state when read; for example, that fraction or number may be selected according to the number of incorrect bits that may be repaired by way of redundant rows or columns available to the array. It is contemplated that reference voltage level VREF_HI will typically vary from integrated circuit (i.e., from die to die within the same wafer); as such, it is contemplated that process 44 will be performed individually for each die on the wafer under test.

Figure 5B:
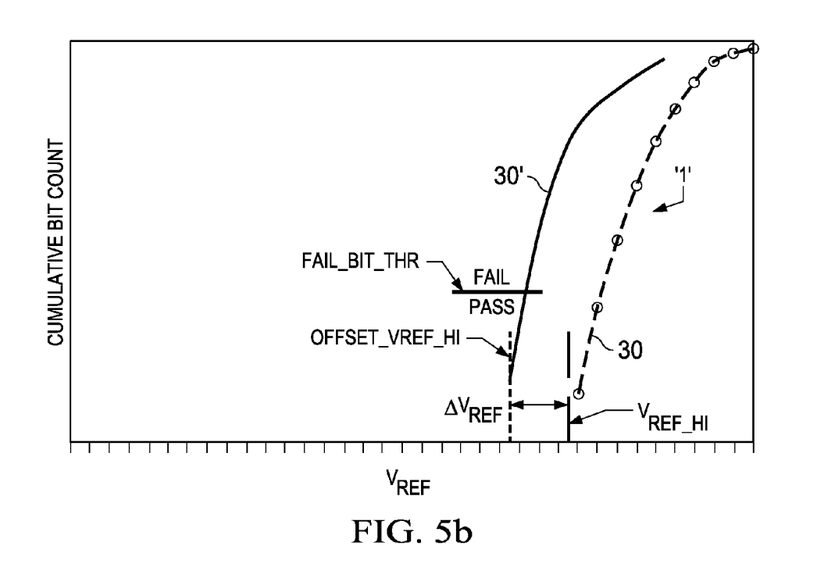

Following the determination of reference voltage level VREF_HI in process 44, process 46 is then performed to determine, in process 46 and for each individual device, an offset reference voltage level OFFSET_VREF_HI. According to this embodiment, this offset reference voltage level OFFSET_VREF_HI for a given integrated circuit is based on, and determined relative to, the reference voltage level VREF_HI determined in process 44 for that device. FIG. 5b illustrates an example of the relationship between offset reference voltage level OFFSET_VREF_HI and reference voltage level VREF_HI on which it is based. FIG. 5b illustrates plots 30, 30' corresponding to the cumulative failed bit distribution of an FRAM array before and after a long-term data retention bake, as discussed above relative to FIG. 3a. Reference voltage level VREF_HI corresponds to the reference voltage level at which programmed "1" bits begin to fail when read for an FRAM array not subjected to a data retention bake, according to plot 30. On the other hand, offset reference voltage level OFFSET_VREF_HI is intended to reflect the reference voltage level at which programmed "1" bits begin to fail when read for an FRAM array that has been subjected to a data retention bake, according to plot 30'. In other words, the voltage differential $\Delta V_{REF}$ between reference voltage level VREF_HI and offset reference voltage level OFFSET_VREF_HI is intended to reflect the expected degradation for a typical "healthy" FRAM array over its operating life, as evaluated by way of a data retention bake (e.g., 1000 hours at 125 deg C.).

Of course, it is not possible to determine the expected degradation for an FRAM array at the time of its manufacture by actually performing the data retention bake. Accordingly, offset reference voltage level OFFSET_VREF_HI may be determined in process 46, for each integrated circuit die, as a preselected fraction or percentage of reference voltage level VREF_HI determined in process 44. For example, process 46 may determine offset reference voltage level OFFSET_VREF_HI to have a magnitude that is 80%, or alternatively 90%, of the magnitude of reference voltage level VREF_HI determined in process 44 for that device. Alternatively, offset reference voltage level OFFSET_VREF_HI may be determined in process 46 to be a certain voltage differential $\Delta V_{REF}$ lower (in magnitude) than reference voltage level VREF_HI for that device.

In process 48, the test equipment programs a selected number of cells in the FRAM array of the integrated circuit to the "1" data state (i.e., the "−1" polarization state in the example of cells $2_{jk}$ of FIG. 2a). It is contemplated that the number of cells programmed in process 48 will be a significant number; considering that the "1" data state is likely to be the worse case for data retention, it may be beneficial to program all of the cells in the array to a "1" data state in process 48. Alternatively, a checkerboard or other pattern of "1" and "0" data states may be programmed into the array in process 48.

In process 50, the wafer including the integrated circuits with FRAM cells programmed to "1" data states in process 48 is heated to an elevated temperature. It is contemplated that heating process 50 may be performed in various ways. A particularly efficient approach for heating process 50 is to place the wafer onto a heated chuck at a multiprobe test station; similarly, but alternatively, the chuck on which the wafer has been tested in processes 42, 44, 48 may be heated from room temperature to the desired elevated temperature. According to this embodiment, the temperature to which the wafer is heated in process 50 may range from about 60 deg C. to about 125 deg C. However, experimental observation has shown that the reliability screen according to this embodiment can be effective at temperatures of about 60 deg C. As such, heating process 50 heats the wafer to at least about 60 deg C. in this embodiment. The duration of heating process 50, over which the wafer is maintained at this elevated temperature, is not particularly critical; indeed, the maintaining of the wafer at the elevated temperature for the few seconds required for the multiprobe test station to align its probes over the first integrated circuit on the wafer to be tested has been found sufficient for purposes of this screen.

In process 52, with the wafer and thus the integrated circuit under test heated in process 50 to the elevated temperature of at least about 60 deg C., the automated test equipment accesses those FRAM cells $2_{jk}$ that were programmed to a "1" data state in process 48, and senses the state of those cells by the appropriate sense amplifiers 8 applying the offset reference voltage level OFFSET_VREF_HI determined in process 46 as the reference voltage for discerning a "1" data state from a "0" data state. It is contemplated that most integrated circuits including FRAM cells $2_{jk}$ programmed to the "1" data state will have one or more of those cells fail the stringent read conditions, at the elevated temperature, used in the read test of process 52.

According to this embodiment, those integrated circuits in the population that exhibit a relatively large number of cells $2_{jk}$ failing the read at the elevated temperature and stringent reference voltage performed in process 52 (i.e., by returning a "0" data state rather than the programmed "1" data state) are likely to correspond to the circuits in the population that will exhibit data retention failures after a long-term reliability bake (e.g., 1000 hours at 125 deg C.). Accordingly, in process 54 according to this embodiment, the test equipment counts the number of cells in the integrated circuit that fail the read in process 52, and compares that number of failed cells with a pass/fail threshold in decision 55. As shown in FIG. 5b, the pass/fail threshold FAIL_BIT_THR is set at a number of cells (or percentage of the cells $2_{jk}$ in the FRAM array of that device) that is somewhat greater than the number of cells expected to fail at reference voltage level OFFSET_VREF_HI for a device that would exhibit a normal shift from a long term data retention bake. As discussed above relative to FIG. 3b, the purpose of this screen is to identify those FRAM arrays in weaker portion WK_pop of the overall population that will exhibit a greater-than-normal shift from a long-term data retention bake, and thus over their operating life. It is contemplated that those skilled in the art having reference to this specification will be readily able to determine, from characterization and reliability tests, the appropriate pass/fail threshold FAIL_BIT_THR for particular FRAM array sizes and technology nodes, without undue experimentation.

If the number of failed cells from read process 52 for an integrated circuit die on the wafer exceeds pass/fail threshold FAIL_BIT_THR (decision 55 is "yes"), the die is considered to have failed the screen; if not (decision 55 is "no"), the die is considered to have passed the screen. Processes 52, 54, 55 are then repeated for the next device on the wafer (which is still at the elevated temperature on the hot chuck or otherwise), until the screen is complete for the wafer.

Figure 5C:
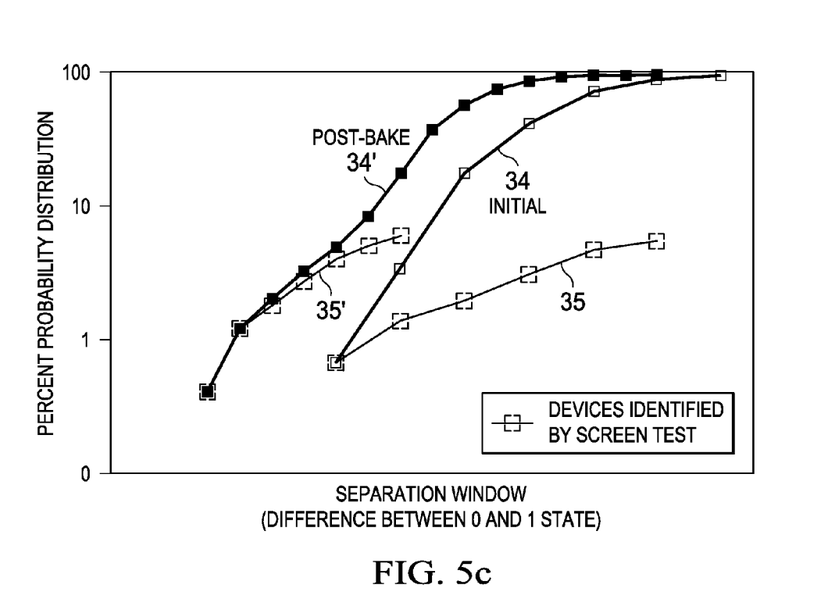
FIG. 5c illustrates plots of failure distribution of a population of integrated circuits including 1T-1C FRAM memories versus separation window, illustrating results form an example of the embodiment of FIG. 4.

It has been observed experimentally that the reliability screen of this embodiment is effective in identifying those integrated circuits vulnerable to data retention failure. FIG. 5c again illustrates plots 34, 34' from FIG. 3b of the separation window for a population of FRAM devices, before and after a data retention bake for 1000 hours at 125 deg C. As discussed above relative to FIG. 3b, the portion of plot 34' shown as weaker portion WK_pop of the overall population show that a number of devices exhibit significantly greater reduction in the separation window as a result of the data retention bake than do others in the population. FIG. 5c also illustrates plots 35, 35' that illustrate the behavior of those devices in that population that failed the reliability screen of the embodiment of FIG. 4, before and after a bake of 1000 hours at 125 deg C., respectively. As evident from FIG. 5c, some of those devices exhibit a very robust separation window before bake, but also exhibits a much larger reduction in that separation window as a result of the bake; in addition, as evident from post-bake plot 35', the devices identified by the reliability screen of this embodiment correspond to those devices in the weaker portion WK_pop of the overall population of plot 34'. As a result, an effective time-zero electrical screen for data retention reliability is provided by this embodiment.

Figure 6:
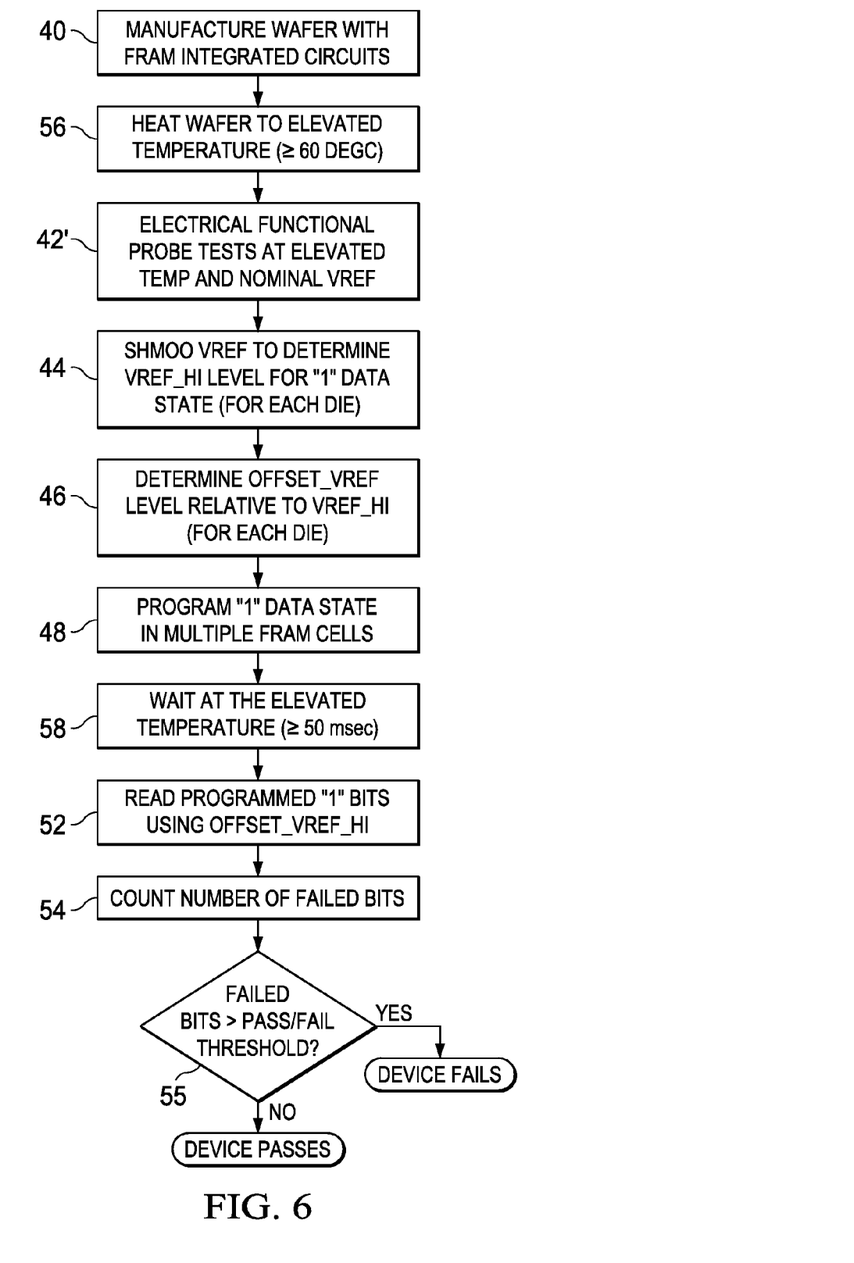
FIG. 6 is a flow diagram of a time-zero reliability screen according to an embodiment.

Referring now to FIG. 6, a method of performing a reliability screen according to another embodiment will be described. As in the embodiment of FIG. 4, the reliability screen according to this embodiment follows manufacturing process 40 in which integrated circuits including ferroelectric memory cells, such as arranged in a memory array, are formed at the surface of a semiconductor wafer in process 40 in the conventional manner.

According to this embodiment, at the time of multiprobe electrical testing of the integrated circuits in the manufactured wafer, the wafer is heated to an elevated temperature in process 56. In this embodiment, the elevated temperature is at least about 60 deg C., which may be attained by placing the wafer on a heated chuck at the multiprobe test station. Upon the wafer being heated in process 56, electrical functional testing (and parametric testing, as desired) of the integrated circuits on the wafer is performed at this elevated temperature in process 42'. As before, the tests performed in process 42' may include conventional functionality tests and device performance tests. As noted above, functional test process 42' is performed at the elevated temperature attained in process 56, and may be performed at the nominal reference voltage VREF_NOM for read operations.

According to this embodiment, and following functional test process 42', shmoo process 44 to determine the reference voltage level VREF_HI for each integrated circuit die, process 46 to determine the offset reference voltage level OFFSET_VREF_HI for each integrated circuit die based on that reference voltage level VREF_HI, and the programming of "1" data states for the desired number of FRAM cells $2_{jk}$ in the devices to be screened in process 48, are performed in the manner described above relative to FIG. 4, but at the elevated temperature attained in process 56.

According to this embodiment, and following programming process 48, the integrated circuits to be screened are maintained at an elevated temperature for a selected duration in process 58. The duration of process 58 is contemplated to be at least about 50 msec, but may be longer for some implementations or technology nodes. For the case in which the screen is being performed in wafer form on a heated chuck at the multiprobe test station, process 58 may be performed simply by pausing for the selected duration after programming process 48. Alternatively, depending on the number of integrated circuits that were programmed in process 48 and on the desired duration, process 58 may naturally occur upon re-indexing of the multiprobe test station from the position of the device last programmed in process 48 to that which was first programmed.

Following the duration of process 58, process 52 is then performed as described above, with the wafer and thus the integrated circuit under test remaining at the elevated temperature of at least about 60 deg C. (e.g., on the same heated chuck) attained in process 56. As described above, those FRAM cells $2_{jk}$ that were programmed to a "1" data state in process 48 are accessed and sensed by sense amplifiers 8 relative to the offset reference voltage level OFFSET_VREF_HI determined in process 46 as the reference voltage for discerning a "1" data state from a "0" data state for that device. The number of cells failing (i.e., returning a "0" data state rather than the programmed "1" data state) the read of process 52 are counted for the integrated circuit in process 54, and compared in decision 55 against pass/fail threshold FAIL_BIT_THR to determine whether the device passes or fails the screen, as described above. Processes 52, 54, 55 are then repeated for the other integrated circuits on the wafer.

This embodiment is contemplated to also identify those integrated circuits in the population that are vulnerable to data retention failure, as described above, but provides the potential advantage of requiring only a single test operation at a constant temperature, rather than (for the example of devices in wafer form) a first multiprobe test sequence at room temperature followed by a second multiprobe test sequence at the elevated temperature, or temperature cycling of the chuck at the multiprobe test equipment, as used in the embodiment of FIG. 4 described above.

Figure 7:
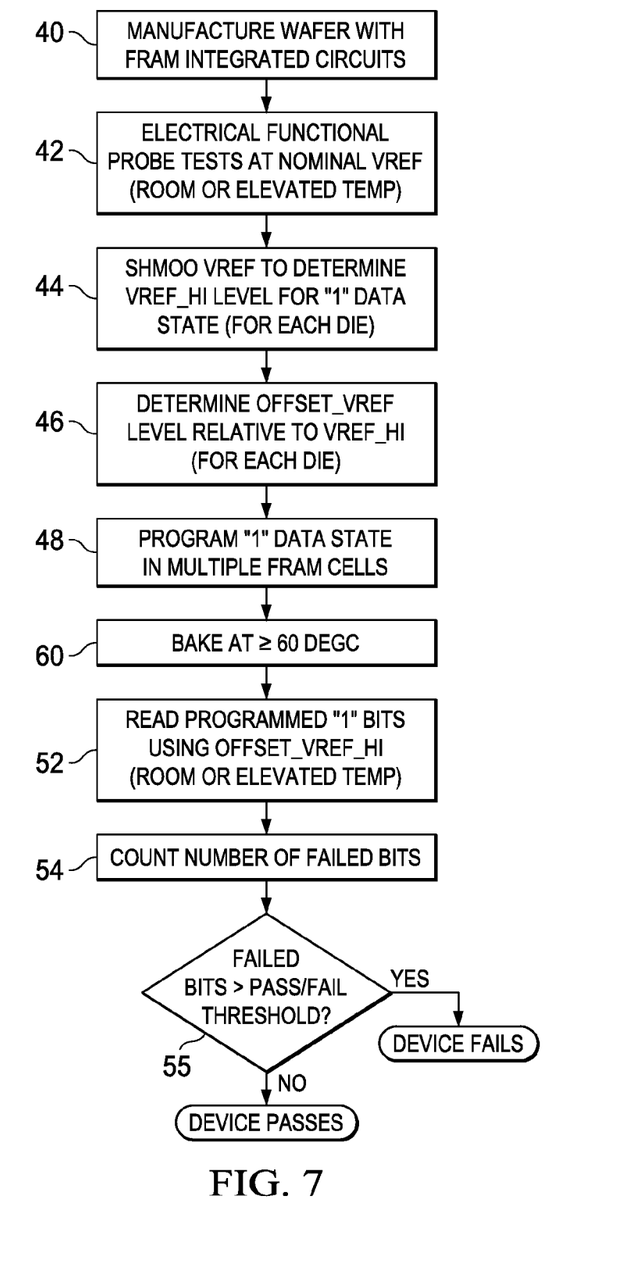
FIG. 7 is a flow diagram of a time-zero reliability screen according to an embodiment.

Referring now to FIG. 7, a reliability screen according to another embodiment will be described. According to this embodiment, which may also be performed on integrated circuits in wafer form, the reliability screen follows the conventional manufacture of integrated circuits including ferroelectric memory cells in process 40.

According to this embodiment, electrical functional testing (and parametric testing, as desired) of the integrated circuits on the wafer is performed in process 42 as described above. The temperature at which process 42 is performed in this embodiment may be at any suitable temperature (i.e., at room temperature, or at an elevated temperature as described above relative to FIG. 6), and may be performed at the nominal reference voltage VREF_NOM for read operations. Following functional test process 42, shmoo process 44 to determine the reference voltage level VREF_HI for each integrated circuit die, process 46 to determine the offset reference voltage level OFFSET_VREF_HI for each integrated circuit die based on that reference voltage level VREF_HI, and programming process 48 to program "1" data states into the desired number of FRAM cells $2_{jk}$ in the devices to be screened, are then performed in the manner described above relative to FIGS. 4 and 6. These operations may be either at room temperature or at an elevated temperature, as desired.

According to this embodiment, following programming process 48, the integrated circuits to be screened are subjected to a high temperature bake. For the case in which the devices are in wafer form, the wafer is removed from the multiprobe test equipment and baked in a conventional oven in process 60. The temperature at which the devices are baked in process 60 may vary from at least about 60 deg C. to about 125 deg C. The duration of the bake of process 60 depends on the apparatus used to perform that bake. If bake process 60 is performed by way of a rapid thermal anneal (RTA), the duration of bake process 60 may be as short as about one second. On the other hand, if bake process 60 is performed using a conventional oven, the duration of bake process is contemplated to be at least about thirty minutes. In any case, bake process 60 is contemplated to effect a short term reduction in the read margin, and as such to enable the detection of those devices that are vulnerable to data retention failure over operating life.

Following the bake of process 60, process 52 is then performed as described above, to access those FRAM cells $2_{jk}$ that were programmed to a "1" data state in process 48, and to sense the data state of those cells by sense amplifiers 8 relative to the offset reference voltage level OFFSET_VREF_HI determined in process 46 as the reference voltage for discerning a "1" data state from a "0" data state for that device. According to this embodiment, the integrated circuit under test may be at any suitable temperature, including room temperature or an elevated temperature; in wafer form, accordingly, the wafer may be tested in process 50 on a heated or unheated chuck, as desired. In process 54, the number of cells failing (i.e., returning a "0" data state rather than the programmed "1" data state) the read of process 52 are counted for the integrated circuit, and in decision 55 that number of failed cells is compared against the preselected pass/fail threshold FAIL_BIT_THR to determine whether the device passes or fails the screen, as described above. Processes 52, 54, 55 are then repeated for the other integrated circuits on the wafer.

This embodiment is contemplated to also identify those integrated circuits in the population that are vulnerable to data retention failure, as described above, but provides additional flexibility in the temperature at which the multiprobe test equipment operates, enabling the performing of all multiprobe testing at room temperature.

According to these embodiments, as discussed above, a time-zero screen for devices that are vulnerable to long-term reliability failures over their operating life is provided. In particular, the data retention capability of ferroelectric memories, which is a primary reliability concern, may be evaluated for all devices as manufactured, which is a significant improvement over conventional approaches that rely on lengthy (1000 hours) testing of small samples of devices to provide only statistical confidence of a population of devices. As a result, the overall reliability of the entire population of ferroelectric integrated circuits manufactured and installed into system applications is improved by these embodiments. It is contemplated that this improvement in data retention reliability for FRAM memories can facilitate the use of 1T-1C FRAM cells for applications that previously required 2T-2C or other latching cells to ensure acceptable data retention performance, which results in the potential for significantly increased memory density and capacity and reduced cost in those circuits.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. For example, while the embodiments are generally described as applied to the screening of integrated circuits in wafer form (i.e., at multiprobe), it is also contemplated that these embodiments may be applied to packaged integrated circuits with ferroelectric memories; for those embodiments in which particular reference voltages are determined on a per-integrated circuit basis, it will be useful of course to track the identity of those individual packaged integrated circuits. In addition, other pass/fail criteria may be applied as may be determined from characterization and as data are gathered. In addition, while the embodiments are described above relative to the example of one binary data state, it is contemplated that the embodiments may readily be implemented for the opposite data state, using voltages complementary to those described herein. It is contemplated that these and other modifications and alternatives are within the scope of this invention as subsequently claimed herein.

What is claimed is:

1. A method of testing an integrated circuit including ferroelectric memory cells, comprising the steps of:

determining a first reference voltage at which fewer than a preselected number of a plurality of ferroelectric memory cells of the integrated circuit that are programmed to a first data state return a second data state when read;

determining a second reference voltage corresponding to a selected differential from the first reference voltage;

programming the plurality of the ferroelectric memory cells to the first data state;

heating the integrated circuit to an elevated temperature;

then reading the plurality of ferroelectric memory cells, at the elevated temperature, wherein the reading step comprises, for each of the plurality of ferroelectric memory cells accessing the memory cell and comparing a voltage produced by the memory cell by the accessing step to the second reference voltage; and then comparing a number of the ferroelectric memory cells from which the second data state, opposite from the first data state, was read by the reading step with a pass/fail threshold number.

2. The method of claim 1, wherein the programming step and the step of determining the first reference voltage are performed at a first temperature;

and wherein the elevated temperature is greater than the first temperature by approximately 30 deg C. or more.

3. The method of claim 2, wherein the elevated temperature is approximately 60 deg C. or greater.

4. The method of claim 1, wherein the programming step is performed at the elevated temperature.

5. The method of claim 4, further comprising:
waiting for a preselected duration with the integrated circuit at the elevated temperature, after the programming step and before the reading step.

6. The method of claim 1, wherein the second reference voltage has a magnitude that is a selected fraction of the magnitude of the first reference voltage.

7. The method of claim 1, wherein each of the plurality of ferroelectric memory cells is of the one transistor-one capacitor (1T-1C) type;
wherein the accessing step comprises:
coupling a first plate of a ferroelectric capacitor in the ferroelectric memory cell to a bit line associated with the ferroelectric memory cell;
and wherein the reading step comprises:
comparing a voltage at the bit line to the second reference voltage.

8. The method of claim 7, wherein the first data state corresponds to polarization of the ferroelectric capacitor to a first polarization state in which the capacitor retains a voltage of a first polarity in the absence of applied voltages;
and wherein the accessing step further comprises:
biasing the second plate of the ferroelectric capacitor to a voltage, relative to the bit line, of a second polarity opposite to the first polarity.

9. The method of claim 1, wherein the integrated circuit is one of a plurality of similar integrated circuits formed in a single integrated circuit wafer;
wherein the programming, heating, and reading steps are performed with the integrated circuit in wafer form;
and wherein the wafer is disposed on a heated chuck during the heating and reading steps.

10. The method of claim 1, further comprising:
performing functional tests of the plurality of ferroelectric memory cells before the programming step.

11. A method of testing an integrated circuit including ferroelectric memory cells, comprising the steps of:
determining a first reference voltage at which fewer than a preselected number of the plurality of ferroelectric memory cells of the integrated circuit that are programmed to a first data state return a second data state when read;
determining a second reference voltage corresponding to a selected differential from the first reference voltage;
programming a plurality of the ferroelectric memory cells to the first data state;
then baking the integrated circuit at an elevated temperature for a selected duration;
then reading each of the plurality of ferroelectric memory cells by:
accessing the memory cell; and
comparing a voltage produced by the memory cell by the accessing step to the second reference voltage; and
then comparing a number of the ferroelectric memory cells from which the second data state, opposite from the first data state, was read by the reading step with a pass/fail threshold number.

12. The method of claim 11, wherein the second reference voltage has a magnitude that is a selected fraction of the magnitude of the first reference voltage.

13. The method of claim 11, wherein the programming step and the step of determining the first reference voltage are performed at a first temperature;
and wherein the reading step is performed at a second temperature that is greater than the first temperature by approximately 30 deg C. or more.

14. The method of claim 13, wherein the second temperature is approximately 60 deg C. or greater.

15. The method of claim 13, wherein the second temperature is about the same temperature as the elevated temperature at which the baking step bakes the integrated circuit.

16. The method of claim 11, wherein the programming step, the step of determining the first reference voltage, and the reading step are performed at about the same temperature.

17. The method of claim 16, wherein the programming step, the step of determining the first reference voltage, and the reading step are performed at room temperature.

18. The method of claim 11, wherein the baking step comprises:
performing a rapid thermal anneal of the integrated circuit for approximately one second or more.

19. The method of claim 11, wherein the baking step comprises:
baking the integrated circuit in an oven for approximately thirty minutes or more.

20. The method of claim 11, wherein the integrated circuit is one of a plurality of similar integrated circuits formed in a single integrated circuit wafer;
and wherein the programming, determining, baking, and reading steps are performed with the integrated circuit in wafer form.

* * * * *